(12) United States Patent
Imbornone et al.

(10) Patent No.: US 12,712,491 B2
(45) Date of Patent: Aug. 18, 2026

(54) BACK GATE BIASING OF CRYSTAL OSCILLATORS FOR ENHANCED NEGATIVE RESISTANCE

(71) Applicant: Skyworks Solutions, Inc., Irvine, CA (US)

(72) Inventors: James Francis Imbornone, Methuen, MA (US); Kheng Chong Tran, Lowell, MA (US); William Edward Moore, Austin, TX (US); Preetham Narayana Reddy, Los Angeles, CA (US); Dinesh Babu Mugunthu Maheswaran, Nashua, NH (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 0 days.

(21) Appl. No.: 19/034,947

(22) Filed: Jan. 23, 2025

(65) Prior Publication Data

US 2025/0247050 A1 Jul. 31, 2025

Related U.S. Application Data

(60) Provisional application No. 63/625,769, filed on Jan. 26, 2024.

(51) Int. Cl.
*H03B 5/36* (2006.01)
*H03B 5/06* (2006.01)
*H03B 5/24* (2006.01)

(52) U.S. Cl.
CPC ............... *H03B 5/364* (2013.01); *H03B 5/06* (2013.01); *H03B 5/24* (2013.01); *H03B 2200/0012* (2013.01); *H03B 2200/009* (2013.01)

(58) Field of Classification Search
CPC . H03B 5/364; H03B 5/06; H03B 5/24; H03B 2200/012; H03B 2200/009
See application file for complete search history.

(56) References Cited

U.S. PATENT DOCUMENTS

| | | | |
|---|---|---|---|
| 7,187,245 | B1 | 3/2007 | Mcmenamy |
| 7,362,193 | B2 | 4/2008 | Mattisson |
| 7,498,893 | B2 | 3/2009 | Koellmann |
| 9,071,194 | B1 | 6/2015 | Djahanshahi et al. |
| 9,112,449 | B2 | 8/2015 | Hsiao |
| 9,252,705 | B2 | 2/2016 | Chataigner et al. |
| 9,413,341 | B1 | 8/2016 | Ho et al. |
| 9,431,956 | B1 | 8/2016 | Djahanshahi et al. |
| 9,438,166 | B1 | 9/2016 | Djahanshahi et al. |

(Continued)

*Primary Examiner* — Jeffrey M Shin

(74) *Attorney, Agent, or Firm* — Knobbe, Martens, Olson & Bear, LLP

(57) ABSTRACT

Apparatus and methods for back gate biasing of crystal oscillators for enhanced negative resistance are disclosed herein. In certain embodiments, a crystal oscillator includes a crystal and an inverter having an input connected to a first terminal of the crystal and an output connected to a second terminal of the crystal. The inverter includes an n-type metal oxide semiconductor (NMOS) transistor and a p-type metal oxide semiconductor (PMOS) transistor that serve to invert an input oscillation signal from the crystal. The crystal oscillator further includes a back gate bias control circuit that adjusts a negative resistance of the inverter by controlling a back gate bias of at least one of the NMOS transistor or the PMOS transistor.

20 Claims, 7 Drawing Sheets

(56) References Cited

U.S. PATENT DOCUMENTS

| | | | |
|---|---|---|---|
| 9,490,746 B1 | 11/2016 | Madala et al. | |
| 9,515,605 B1 | 12/2016 | Madala et al. | |
| 9,787,251 B2 | 10/2017 | Djahanshahi et al. | |
| 9,847,753 B2 | 12/2017 | Ho et al. | |
| 10,063,188 B2 | 8/2018 | Srinivas | |
| 10,090,805 B2 | 10/2018 | Madala et al. | |
| 10,263,628 B2 | 4/2019 | Pagnanelli | |
| 10,483,913 B2 | 11/2019 | Najafi et al. | |
| 10,924,060 B2 | 2/2021 | Pamarti et al. | |
| 10,992,258 B2 | 4/2021 | Matsukawa | |
| 11,082,006 B2 | 8/2021 | Kumar et al. | |
| 11,309,835 B2 | 4/2022 | Liu et al. | |
| 11,476,804 B1 | 10/2022 | Quilligan et al. | |
| 11,671,056 B2 | 6/2023 | Liu et al. | |
| 11,699,974 B1 | 7/2023 | Elkholy et al. | |
| 11,705,861 B1 | 7/2023 | Elkholy et al. | |
| 12,184,233 B2 | 12/2024 | Wu | |
| 12,206,361 B2 | 1/2025 | Graf et al. | |
| 2010/0182094 A1* | 7/2010 | Nasu | H03B 5/366<br>331/116 FE |
| 2015/0214894 A1* | 7/2015 | Calhoun | H03B 5/04<br>331/115 |
| 2017/0194908 A1 | 7/2017 | Madala et al. | |
| 2019/0103837 A1 | 4/2019 | Madala et al. | |
| 2020/0204115 A1* | 6/2020 | Ahmed | H03L 3/00 |
| 2023/0412155 A1 | 12/2023 | Jain et al. | |
| 2023/0421100 A1 | 12/2023 | Strandvik et al. | |

* cited by examiner

BACK GATE BIASING OF CRYSTAL OSCILLATORS FOR ENHANCED NEGATIVE RESISTANCE

CROSS-REFERENCE TO RELATED APPLICATIONS

This application claims the benefit of priority under 35 U.S.C. § 119 of U.S. Provisional Patent Application No. 63/625,769, filed Jan. 26, 2024 and titled “BACK GATE BIASING OF CRYSTAL OSCILLATORS FOR ENHANCED NEGATIVE RESISTANCE,” which is herein incorporated by reference in its entirety.

BACKGROUND

Field

Embodiments of the invention relate to electronic systems, and in particular, to crystal oscillators.

Description of the Related Technology

Crystal oscillators use a mechanical resonance of a crystal to create an oscillation signal having a precise frequency. To establish and maintain oscillation, crystal oscillators include a sustaining amplifier that provides a negative resistance to cancel the crystal’s losses.

Crystal oscillators can be used to generate a reference clock signal for a wide variety of applications. In one example, a wireless device operating in a wireless network (for instance, a Wi-Fi®, cellular, and/or Bluetooth® network) wakes up at certain time intervals to transmit and/or receive signals, and then returns to sleep until a subsequent communication interval. Such wireless devices can use a crystal oscillator to establish a reference frequency. In another example, a crystal oscillator is used in a clocking application to generate a reference frequency for a phase-locked loop (PLL), such as an integer-N PLL or a fractional-N PLL.

One important metric for a crystal oscillator is startup time. For example, in a wireless device application, a crystal oscillator is powered up in advance of a wake-up event to achieve stable oscillation at a target reference frequency to enable communications at a scheduled time.

The startup time of a crystal oscillator depends on the selected crystal. For example, physical properties of crystals vary from one crystal to another as well as amongst different crystal types and/or manufacturers. To guarantee stable oscillation, a worst-case startup time can include margin to account for crystal variations, amplifier process variations, and/or variation in voltage, current, and/or temperature.

SUMMARY

In certain embodiments, the present disclosure relates to a crystal oscillator. The crystal oscillator includes a crystal, an inverter having an input connected to a first terminal of the crystal and an output connected to a second terminal of the crystal, and a back gate bias control circuit. The inverter includes an n-type metal oxide semiconductor transistor and a p-type metal oxide semiconductor transistor configured to invert an input oscillation signal from the crystal, and the back gate bias control circuit is configured to adjust a negative resistance of the inverter by controlling a body bias of at least one of the n-type metal oxide semiconductor transistor or the p-type metal oxide semiconductor transistor.

In various embodiments, the back gate bias control circuit controls a body bias of both the n-type metal oxide semiconductor transistor and the p-type metal oxide semiconductor transistor.

In some embodiments, the back gate bias control circuit controls a body bias of the n-type metal oxide semiconductor transistor but not the p-type metal oxide semiconductor transistor.

In several embodiments, the back gate bias control circuit controls a body bias of the p-type metal oxide semiconductor transistor but not the n-type metal oxide semiconductor transistor.

In various embodiments, the back gate bias control circuit sets the back gate bias to a first level during startup of the crystal oscillator and to a second level during steady state operation of the crystal oscillator.

In some embodiments, the back gate bias control circuit includes a first body resistor connected between a body and a source of one of the n-type metal oxide semiconductor transistor or the p-type metal oxide semiconductor transistor, and a first controllable current source configured to provide a first current to the first body resistor. In a number of embodiments, the back gate bias control circuit further includes a first bypass switch connected in parallel with the first body resistor. In accordance with various embodiments, the back gate bias control circuit further includes a first filtering capacitor connected in parallel with the first body resistor. According to several embodiments, the back gate bias control circuit includes a second body resistor connected between a body and a source of the other of the n-type metal oxide semiconductor transistor or the p-type metal oxide semiconductor transistor, and a second controllable current source configured to provide a second current to the second body resistor.

In various embodiments, the crystal oscillator further includes a reference voltage control circuit configured to provide a reference voltage to a source of the p-type metal oxide semiconductor transistor, the reference voltage control circuit configured to further adjust the negative resistance of the inverter by controlling a voltage level of the reference voltage. According to a number of embodiments, the reference voltage control circuit sets the reference voltage to a first level during startup and to a second level during steady state operation.

In several embodiments, a source of the p-type metal oxide semiconductor transistor is connected to a reference voltage, a gate of the p-type metal oxide semiconductor transistor is connected to an input of the inverter, a drain of the p-type metal oxide semiconductor transistor is connected to an output of the inverter, a source of the n-type metal oxide semiconductor transistor is connected to a ground voltage, a gate of the n-type metal oxide semiconductor transistor is connected to the input of the inverter, and a drain of the n-type metal oxide semiconductor transistor is connected to the output of the inverter. According to a number of embodiments, the crystal oscillator further includes a first feedback resistor connected between the input and the output of the inverter, and a second feedback resistor and a switch connected in series between the input and the output of the inverter.

In certain embodiments, the present disclosure relates to a method of generating an oscillation signal using a crystal oscillator is disclosed. The method includes receiving an input oscillation signal from a crystal as an input to an inverter, inverting the input oscillation using an n-type metal oxide semiconductor transistor and a p-type metal oxide semiconductor transistor of the inverter, and adjusting a negative resistance of the inverter by controlling a body bias of at least one of the n-type metal oxide semiconductor transistor or the p-type metal oxide semiconductor transistor using a back gate bias control circuit.

In several embodiments, adjusting the negative resistance includes controlling a body bias of both the n-type metal oxide semiconductor transistor and the p-type metal oxide semiconductor transistor.

In some embodiments, adjusting the negative resistance includes controlling a body bias of the n-type metal oxide semiconductor transistor but not the p-type metal oxide semiconductor transistor.

In various embodiments, adjusting the negative resistance includes controlling a body bias of the p-type metal oxide semiconductor transistor but not the n-type metal oxide semiconductor transistor.

In some embodiments, the back gate bias control circuit sets the back gate bias to a first level during startup and to a second level during steady state operation.

In several embodiments, the back gate bias control circuit includes a first body resistor connected between a body and a source of one of the n-type metal oxide semiconductor transistor or the p-type metal oxide semiconductor transistor, and a first controllable current source configured to provide a first current to the first body resistor. According to a number of embodiments, the back gate bias control circuit further includes a first bypass switch connected in parallel with the first body resistor. In accordance with various embodiments, the back gate bias control circuit further includes a first filtering capacitor connected in parallel with the first body resistor. According to some embodiments, the back gate bias control circuit includes a second body resistor connected between a body and a source of the other of the n-type metal oxide semiconductor transistor or the p-type metal oxide semiconductor transistor, and a second controllable current source configured to provide a second current to the second body resistor.

In various embodiments, the method further includes providing a reference voltage to a source of the p-type metal oxide semiconductor transistor using a reference voltage control circuit, and further adjusting the negative resistance of the inverter by controlling a voltage level of the reference voltage. According to a number of embodiments, the reference voltage control circuit sets the reference voltage to a first level during startup and to a second level during steady state operation.

In some embodiments, a source of the p-type metal oxide semiconductor transistor is connected to a reference voltage, a gate of the p-type metal oxide semiconductor transistor is connected to an input of the inverter, a drain of the p-type metal oxide semiconductor transistor is connected to an output of the inverter, a source of the n-type metal oxide semiconductor transistor is connected to a ground voltage, a gate of the n-type metal oxide semiconductor transistor is connected to the input of the inverter, and a drain of the n-type metal oxide semiconductor transistor is connected to the output of the inverter. According to several embodiments, the method further includes a first feedback resistor connected between the input and the output of the inverter, and a second feedback resistor and a switch connected in series between the input and the output of the inverter.

In certain embodiments, the present disclosure relates to a timing system that includes a phase locked-loop configured to receive a reference clock signal, and a crystal oscillator. The crystal oscillator includes a crystal and an inverter having an input connected to a first terminal of the crystal and an output connected to a second terminal of the crystal, the inverter including an n-type metal oxide semiconductor transistor and a p-type metal oxide semiconductor transistor configured to invert an input oscillation signal from the crystal to generate the reference clock signal. The crystal oscillator further includes a back gate bias control circuit configured to adjust a negative resistance of the inverter by controlling a body bias of at least one of the n-type metal oxide semiconductor transistor or the p-type metal oxide semiconductor transistor.

In some embodiments, the back gate bias control circuit controls a body bias of both the n-type metal oxide semiconductor transistor and the p-type metal oxide semiconductor transistor.

In various embodiments, the back gate bias control circuit controls a body bias of the n-type metal oxide semiconductor transistor but not the p-type metal oxide semiconductor transistor.

In several embodiments, the back gate bias control circuit controls a body bias of the p-type metal oxide semiconductor transistor but not the n-type metal oxide semiconductor transistor.

In some embodiments, the back gate bias control circuit sets the back gate bias to a first level during startup of the crystal oscillator and to a second level during steady state operation of the crystal oscillator.

In various embodiments, the back gate bias control circuit includes a first body resistor connected between a body and a source of one of the n-type metal oxide semiconductor transistor or the p-type metal oxide semiconductor transistor, and a first controllable current source configured to provide a first current to the first body resistor. According to several embodiments, the back gate bias control circuit further includes a first bypass switch connected in parallel with the first body resistor. In accordance with a number of embodiments, the back gate bias control circuit further includes a first filtering capacitor connected in parallel with the first body resistor. According to some embodiments, the back gate bias control circuit includes a second body resistor connected between a body and a source of the other of the n-type metal oxide semiconductor transistor or the p-type metal oxide semiconductor transistor, and a second controllable current source configured to provide a second current to the second body resistor.

In several embodiments, the timing system further includes a reference voltage control circuit configured to provide a reference voltage to a source of the p-type metal oxide semiconductor transistor, the reference voltage control circuit configured to further adjust the negative resistance of the inverter by controlling a voltage level of the reference voltage. According to some embodiments, the reference voltage control circuit sets the reference voltage to a first level during startup and to a second level during steady state operation.

In various embodiments, a source of the p-type metal oxide semiconductor transistor is connected to a reference voltage, a gate of the p-type metal oxide semiconductor transistor is connected to an input of the inverter, a drain of the p-type metal oxide semiconductor transistor is connected to an output of the inverter, a source of the n-type metal oxide semiconductor transistor is connected to a ground voltage, a gate of the n-type metal oxide semiconductor transistor is connected to the input of the inverter, and a drain of the n-type metal oxide semiconductor transistor is connected to the output of the inverter. According to a number of embodiments, the timing system further includes a first feedback resistor connected between the input and the output of the inverter, and a second feedback resistor and a switch connected in series between the input and the output of the inverter.

In certain embodiments, the present disclosure relates to an integrated circuit for a crystal oscillator. The integrated circuit includes an input pad and an output pad configured to connect to a crystal. The integrated circuit further includes an inverter having an input connected to the input pad and an output connected to the output pad, the inverter including an n-type metal oxide semiconductor transistor and a p-type metal oxide semiconductor transistor configured to invert an input oscillation signal from the input pad. The integrated circuit further includes a back gate bias control circuit configured to adjust a negative resistance of the inverter by controlling a body bias of at least one of the n-type metal oxide semiconductor transistor or the p-type metal oxide semiconductor transistor.

In various embodiments, the back gate bias control circuit controls a body bias of the n-type metal oxide semiconductor transistor but not the p-type metal oxide semiconductor transistor.

In some embodiments, the back gate bias control circuit controls a body bias of the p-type metal oxide semiconductor transistor but not the n-type metal oxide semiconductor transistor.

In several embodiments, the back gate bias control circuit sets the back gate bias to a first level during startup of the crystal oscillator and to a second level during steady state operation of the crystal oscillator.

In various embodiments, the back gate bias control circuit includes a first body resistor connected between a body and a source of one of the n-type metal oxide semiconductor transistor or the p-type metal oxide semiconductor transistor, and a first controllable current source configured to provide a first current to the first body resistor. According to a number of embodiments, the back gate bias control circuit further includes a first bypass switch connected in parallel with the first body resistor. In accordance with several embodiments, the back gate bias control circuit further includes a first filtering capacitor connected in parallel with the first body resistor. According to some embodiments, the back gate bias control circuit includes a second body resistor connected between a body and a source of the other of the n-type metal oxide semiconductor transistor or the p-type metal oxide semiconductor transistor, and a second controllable current source configured to provide a second current to the second body resistor.

In several embodiments, the integrated circuit further includes a reference voltage control circuit configured to provide a reference voltage to a source of the p-type metal oxide semiconductor transistor, the reference voltage control circuit configured to further adjust the negative resistance of the inverter by controlling a voltage level of the reference voltage. According to a number of embodiments, the reference voltage control circuit sets the reference voltage to a first level during startup and to a second level during steady state operation.

In various embodiments, a source of the p-type metal oxide semiconductor transistor is connected to a reference voltage, a gate of the p-type metal oxide semiconductor transistor is connected to an input of the inverter, a drain of the p-type metal oxide semiconductor transistor is connected to an output of the inverter, a source of the n-type metal oxide semiconductor transistor is connected to a ground voltage, a gate of the n-type metal oxide semiconductor transistor is connected to the input of the inverter, and a drain of the n-type metal oxide semiconductor transistor is connected to the output of the inverter. In accordance with several embodiments, the integrated circuit further includes a first feedback resistor connected between the input and the output of the inverter, and a second feedback resistor and a switch connected in series between the input and the output of the inverter.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1A:
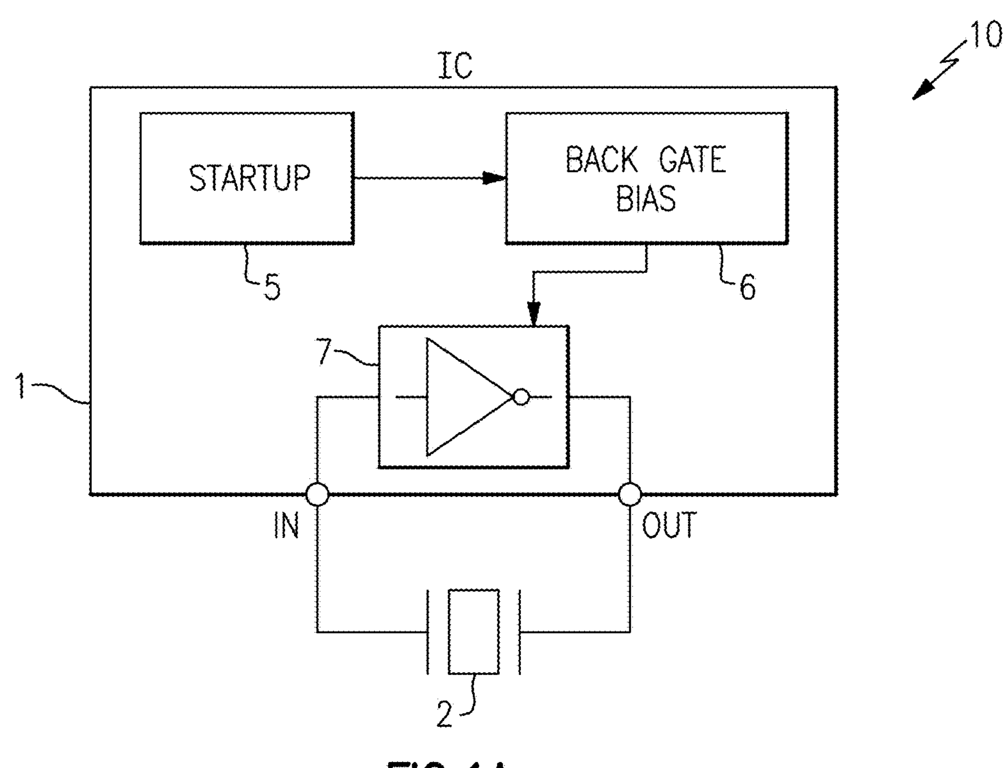
FIG. 1A is a schematic diagram of a crystal oscillator according to one embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Crystal oscillators can be designed to have a negative resistance much greater than a motional series resistance of a crystal to ensure reliable and fast startup. Crystals can have a wide variation in their equivalent series resistance (ESR), and a multiple of the worst case ESR is needed in terms of the crystal oscillator's negative resistance.

Negative resistance is difficult to come by in advanced processing technologies, such as low-power deep submicron complementary metal oxide semiconductor (CMOS) technologies.

Furthermore, certain crystal oscillator topologies, such as a Pierce gate crystal oscillator topology, do not include a tail current source that can be adjusted to achieve different levels of transconductance and corresponding negative resistance values. Thus, for conventional Pierce gate crystal oscillators, the negative resistance and available choice of crystals has been constrained by a worst-case scenario. Thus, meeting the negative resistance requirement for a worst-case crystal's series resistance is extremely challenging.

Apparatus and methods for back gate biasing of crystal oscillators for enhanced negative resistance are disclosed herein. In certain embodiments, a crystal oscillator includes a crystal and an inverter having an input connected to a first terminal of the crystal and an output connected to a second terminal of the crystal. The inverter includes an n-type metal oxide semiconductor (NMOS) transistor and a p-type metal oxide semiconductor (PMOS) transistor that serve to invert an input oscillation signal from the crystal. The crystal oscillator further includes a back gate bias control circuit that adjusts a negative resistance of the inverter by controlling a back gate bias of at least one of the NMOS transistor or the PMOS transistor.

In certain implementations, the back gate bias control circuit controls the back gate bias to an initial bias level during startup to reduce the crystal oscillator's turn on time, and thereafter sets the back gate bias to a steady-state bias level that achieves robust jitter and/or phase noise performance during normal operation. Accordingly, both the benefits of fast startup time and superior noise performance are achieved.

Applying back gate bias (for example, a slight forward body bias) during startup increases negative resistance. For example, back gate bias can be applied to lower the threshold voltage and increase the transconductance of the inverter. Since the negative resistance of a Pierce gate crystal oscillator is a function of the inverter's transconductance, applying back gate bias in this manner enhances negative resistance.

Accordingly, the teachings herein can be used to enhance a negative resistance of a Pierce gate crystal oscillator topology, which does not include a tail current source that can be varied to control negative resistance.

Since the Pierce gate crystal oscillator has superior phase noise performance (due to the lack of a tail current source adding noise), the back gate biasing schemes herein can be used to achieve the superior phase noise performance associated with the Pierce gate crystal oscillator while providing a knob (body biasing of NMOS and/or PMOS transistors) to increase negative resistance during startup. This in turn allows for the use of a wider range of crystals (including inexpensive crystals) as well as implementation in advanced processing technologies with reduced gate geometries.

FIG. 1A is a schematic diagram of a crystal oscillator 10 according to one embodiment. The crystal oscillator 10 includes an integrated circuit (IC) 1 and a crystal 2. The IC 1 includes a startup circuit 5, a back gate bias circuit 6, and an inverter 7 that serves as a sustaining amplifier for maintaining oscillations of the crystal 2.

As shown in FIG. 1A, an input of the inverter 7 is connected to an input pad or pin (IN) of the IC 1, which in turn is connected to a first terminal of the crystal 2. Additionally, an output of the inverter 7 is connected to an output pad (OUT) of the IC 1, which in turn is connected to a second terminal of the crystal 2. An IC, such as the IC 1 of FIG. 1A, is also referred to herein as a semiconductor die or chip.

The input of the inverter 7 receives an input oscillation signal from the first terminal of the crystal 2. The inverter 7 inverts the input oscillation signal to generate an output oscillation signal that is provided to the second terminal of the crystal 2.

As shown in FIG. 1A, a back gate bias of the inverter 7 is controlled by a back gate bias circuit 6. The back gate bias circuit 6 controls a back gate bias of at least one of an NMOS transistor or a PMOS transistor of the inverter 7 to thereby control a negative resistance of the inverter 7.

In the illustrated embodiment, the back gate bias circuit 6 is controlled by a startup circuit 5 that activates a startup sequence when the IC 1 is turned on. In certain implementations, the back gate bias control circuit 6 controls the back gate bias to an initial bias level during startup to reduce the crystal oscillator's turn on time, and thereafter sets the back gate bias to a steady-state bias level that achieves robust jitter and/or phase noise performance during normal operation. Accordingly, both the benefits of fast startup time and superior noise performance are achieved.

Figure 1B:
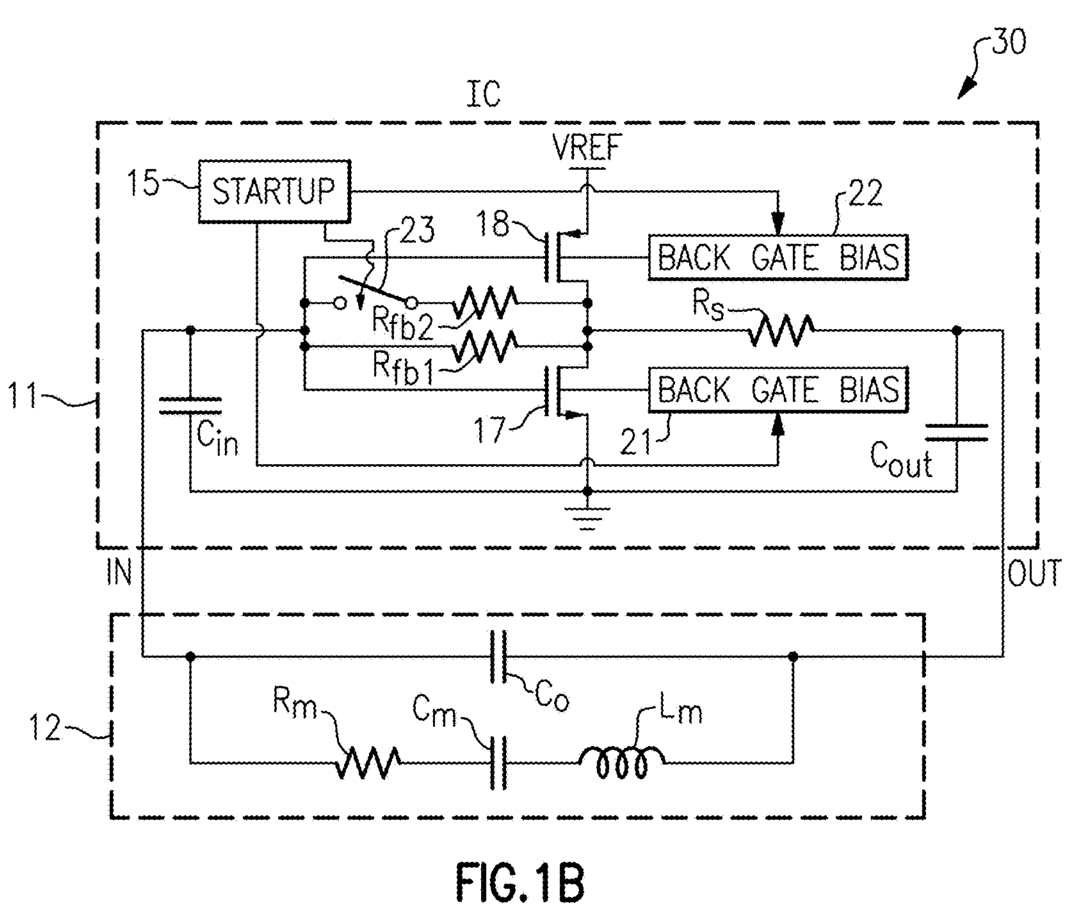
FIG. 1B is a schematic diagram of a crystal oscillator according to another embodiment.

FIG. 1B is a schematic diagram of a crystal oscillator 30 according to another embodiment. The crystal oscillator 30 includes an IC 11 and a crystal 12, which is represented using a circuit model that includes a motional series resistor $R_m$, a motional series capacitor $C_m$, a motional series inductor $L_m$, and a parallel capacitor $C_o$.

As shown in FIG. 1B, the IC 11 includes an input pad IN, an output pad OUT, an input capacitor $C_{in}$, an output capacitor $C_{out}$, a first feedback resistor $R_{fb1}$, a second feedback resistor $R_{fb2}$, a series output resistor $R_s$, a startup circuit 15, an NMOS inverter transistor 17, a PMOS inverter transistor 18, an NMOS back gate bias circuit 21, a PMOS back gate bias circuit 22, and a switch 23.

The NMOS inverter transistor 17 includes a source connected to ground, a gate connected to the input pad IN, a drain connected to a drain of the PMOS inverter transistor 18, and a body controlled by the NMOS back gate bias circuit 21. The PMOS inverter transistor 18 includes a source connected to a reference voltage VREF, a gate connected to the input pad IN, a drain connected to the drain of the NMOS inverter transistor 17, and a body controlled by the PMOS back gate bias circuit 22. The drains of the NMOS inverter transistor 17 and the PMOS inverter transistor 18 are connected to the output pad OUT through the series output resistor $R_s$, which in serves in part to limit output current to the crystal 12 to thereby prevent inadvertent damage.

The NMOS inverter transistor 17 and the PMOS inverter transistor 18 form an inverter. During operation of the crystal oscillator 30, the inverter serves to invert an input oscillation signal from the crystal 12 to generate an output oscillation signal that is provided to the crystal 12. Thus, the inverter operates in a feedback loop with the crystal 12 to maintain oscillations.

The inverter provides a negative resistance that should be much greater (for instance, at least three times) a resistance of the motional series resistor $R_m$ of the crystal 12 to ensure reliable and fast startup. Crystals can have a wide variation in motional series resistance. Furthermore, negative resistance is difficult to come by in advanced processing technologies, such as when the IC 11 is fabricated using a low-power deep submicron CMOS technology. Moreover, the depicted crystal oscillator lacks a tail current that can be adjusted to control negative resistance.

However, as shown in FIG. 1B, the body bias of the NMOS inverter transistor 17 is controlled by the NMOS back gate bias circuit 21 and/or the body bias of the PMOS inverter 18 is controlled by the PMOS back gate bias circuit 22 to provide control over the inverter's negative resistance during startup.

By implementing a crystal oscillator's inverter with back gate bias in this manner, negative resistance can be controlled during startup. Accordingly, fast and robust startup can be achieved. Moreover, negative resistance control is advantageously achieved without needing a tail current source, which adds noise. Accordingly, the depicted configuration can achieve both fast startup and superior phase noise performance.

In the illustrated embodiment, the startup circuit 15 is used to activate the NMOS back gate bias circuit 21 and/or PMOS back gate bias circuit 22 during startup of the IC 11 to achieve a temporary enhancement in negative resistance of the crystal oscillator 30. Thus, the body bias of the NMOS inverter transistor 21 and/or the body bias of the PMOS inverter transistor 22 can be adjusted during startup to enhance negative resistance, and thereafter returned to nominal bias to achieve low phase noise performance.

In the illustrated embodiment, the first feedback resistor $R_{fb1}$ is connected between the inverter's input (node connected to gates of transistors 17 and 18) and the inverter's output (node connected to drains of the transistors 17 and 18), while the second feedback resistor $R_{fb2}$ is connected in series with the switch 23 between the inverter's input and output. The startup circuit 15 also temporarily closes the switch 23 as part of a startup sequence to decrease the feedback resistance value during startup (by placing the second feedback resistor $R_{fb2}$ in parallel with the first feedback resistor $R_{fb1}$). This in turn provides an even further reduction in startup time of the crystal oscillator 30.

The startup circuit 15 can be implemented in a wide variety of ways, including using digital and/or analog techniques.

In a first example, the startup circuit 15 includes a digital state machine that sequences through a series of states in response to startup (for instance, powering on) of the IC 11. The series of states can include a state in which the NMOS back gate bias circuit 21 and/or PMOS back gate bias circuit 22 are activated to provide a temporary enhancement to negative resistance.

In a second example, the startup circuit 15 is implemented as an analog circuit that includes a peak detector that detects an oscillation signal strength of the crystal 12 (for example, a signal strength at an input and/or output of the inverter). Additionally, the NMOS back gate bias circuit 21 and/or PMOS back gate bias circuit 22 are activated by the analog circuitry to provide a temporary enhancement to negative resistance until the peak detector indicates that oscillations are of a sufficient signal strength (for instance, greater than a signal threshold).

Figure 2:
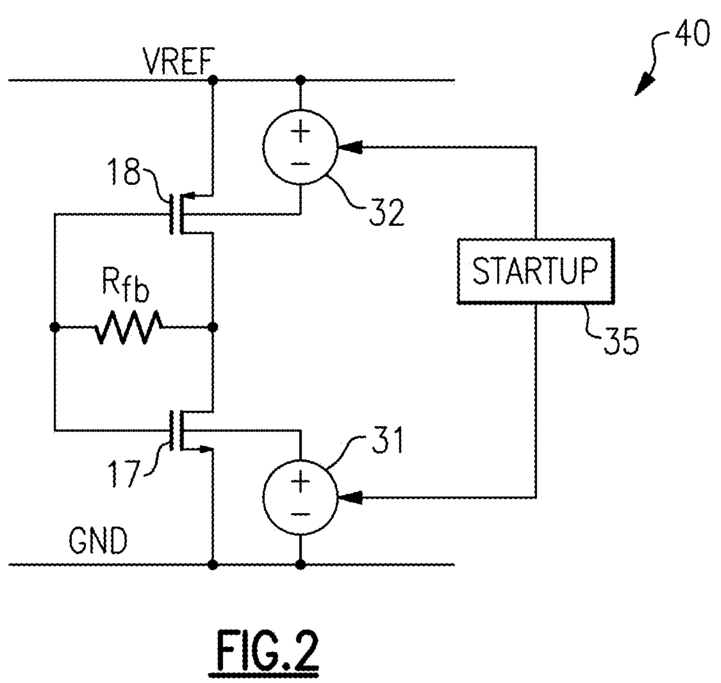
FIG. 2 is a schematic diagram of back gate bias circuitry for a crystal oscillator according to one embodiment.

FIG. 2 is a schematic diagram of back gate bias circuitry 40 for a crystal oscillator according to one embodiment. In the illustrated embodiment, an NMOS inverter transistor 17, a PMOS inverter transistor 18, and a feedback resistor $R_{fb}$ of the crystal oscillator are depicted. The NMOS inverter transistor 17 includes a source connected to ground GND, a gate connected to a first end of the feedback resistor $R_{fb}$, and a drain connected to a second end of the feedback resistor $R_{fb}$. Additionally, the PMOS inverter transistor 18 includes a source connected to a reference voltage VREF, a gate connected to the first end of the feedback resistor $R_{fb}$, and a drain connected to the second end of the feedback resistor $R_{fb}$.

In the illustrated embodiment, the back gate bias circuitry 40 includes a first controllable voltage source 31 that controls a back gate bias of the NMOS inverter transistor 17, a second controllable voltage source 32 that controls a back gate bias of the PMOS inverter transistor 18, and a startup circuit 35 that provides a back gate bias voltage adjustment to the NMOS inverter transistor 17 and/or the PMOS inverter transistor 18 during startup to provide an enhancement to negative resistance.

Figure 3:
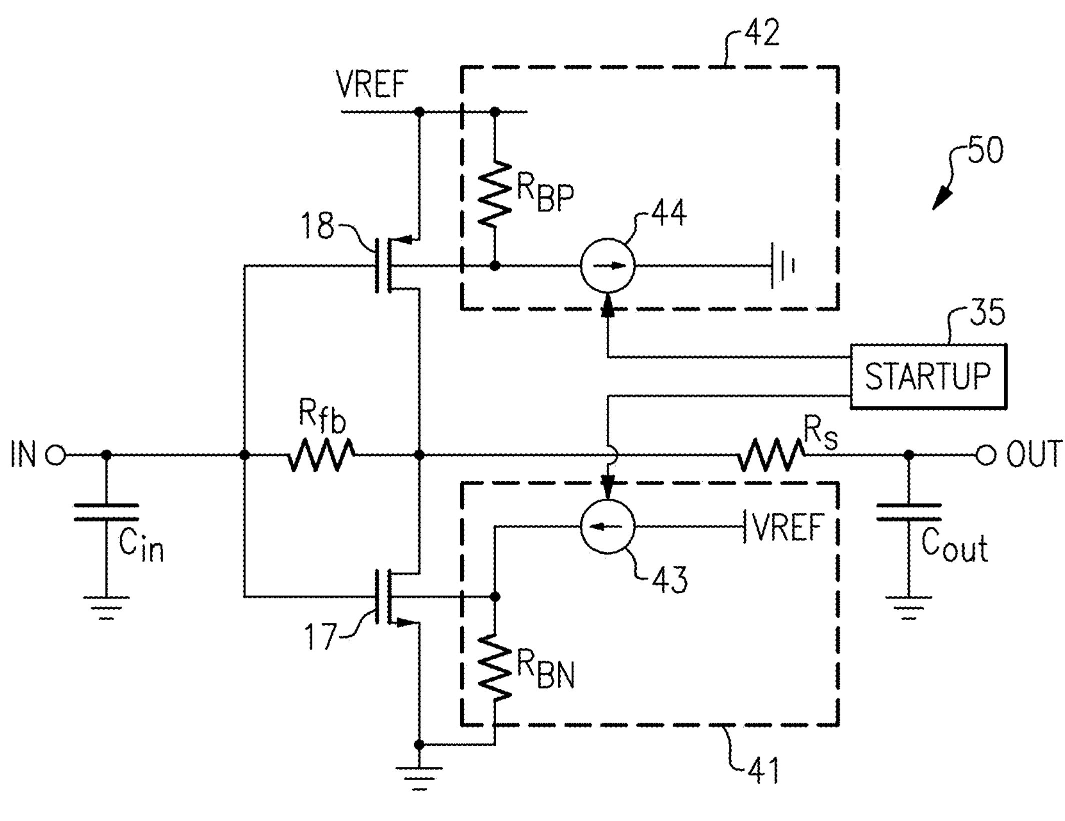
FIG. 3 is a schematic diagram of back gate bias circuitry for a crystal oscillator according to another embodiment.

FIG. 3 is a schematic diagram of back gate bias circuitry 50 for a crystal oscillator according to another embodiment. In the illustrated embodiment, an NMOS inverter transistor 17, a PMOS inverter transistor 18, a feedback resistor $R_{fb}$, a series output resistor $R_s$, an input capacitor $C_{in}$, and an output capacitor $C_{out}$ of the crystal oscillator are depicted.

The back gate bias circuitry 50 includes an NMOS back gate bias circuit 41 that controls a back gate bias of the NMOS inverter transistor 17, a PMOS back gate bias circuit 42 that controls a back gate bias of the PMOS inverter transistor 18, and a startup circuit 35 that provides a back gate bias voltage adjustment to the NMOS inverter transistor 17 and/or the PMOS inverter transistor 18 during startup to provide an enhancement to negative resistance.

In the illustrated embodiment, NMOS back gate bias circuit 41 includes a first body resistor $R_{BN}$ connected between a body of the NMOS inverter transistor 17 and ground, and a first controllable current source 43 connected between the reference voltage VREF and the body of the NMOS inverter transistor 17. As shown in FIG. 3, the first controllable current source 43 is controlled by a first control signal from the startup circuit 35. The first control signal can be used to temporarily increase (for example, pulse) a current from the first controllable current source 43 during startup to temporarily raise the body voltage of the NMOS inverter transistor 17 to enhance negative resistance. During steady state operation of the crystal oscillator, the first controllable current source 43 can provide little to no current such that the first body resistor $R_{BN}$ pulls the body voltage of the NMOS inverter transistor 17 to ground.

As shown in FIG. 3, the PMOS back gate bias circuit 42 includes a second body resistor $R_{BP}$ connected between a body of the PMOS inverter transistor 18 and the reference voltage VREF, and a second controllable current source 44 connected between the body of the PMOS inverter transistor 18 and ground. The second controllable current source 44 is controlled by a second control signal from the startup circuit 35. During startup, the second control signal is used to temporarily increase (for example, pulse) a current from the second controllable current source 44 to enhance negative resistance. During steady state operation of the crystal oscillator, the second controllable current source 44 can provide little to no current such that the second body resistor $R_{BP}$ pulls the body voltage of the PMOS inverter transistor 18 to the reference voltage VREF.

Figure 4:
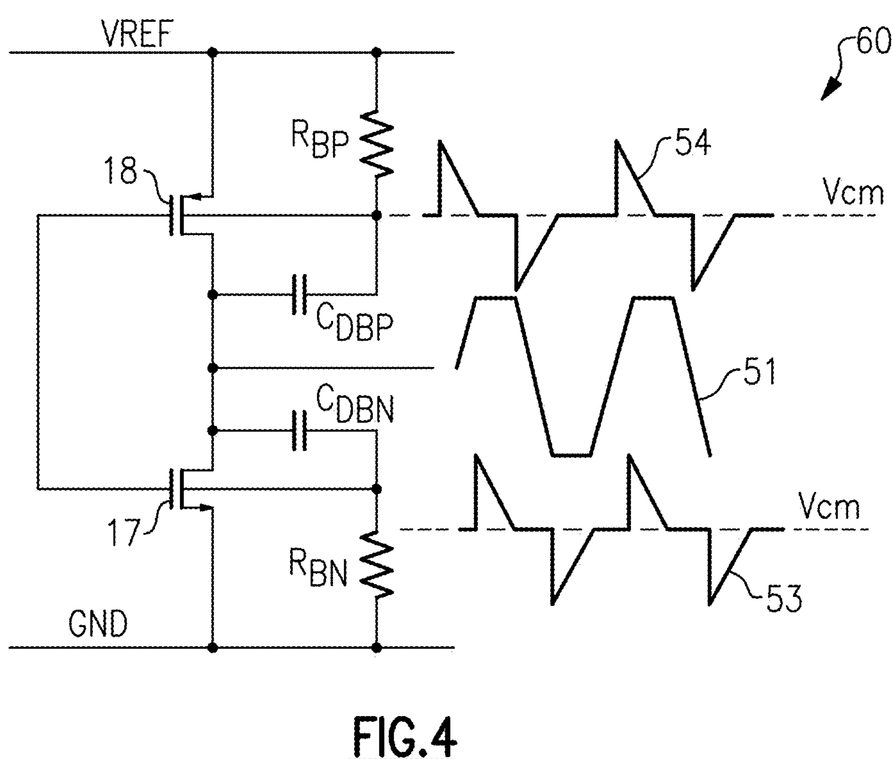
FIG. 4 is a schematic diagram depicting oscillator noise for another embodiment of back gate bias circuitry for a crystal oscillator.

FIG. 4 is a schematic diagram depicting oscillator noise for another embodiment of back gate bias circuitry 60 for a crystal oscillator. The schematic diagram graphically illustrates oscillator noise that can arise from the presence of body resistors.

In the illustrated embodiment, an NMOS inverter transistor 17 and a PMOS inverter transistor 18 of the crystal oscillator are depicted alongside a first body resistor $R_{BN}$ and a second body resistor $R_{BP}$ of the back gate bias circuitry 60. Additionally, a parasitic drain-to-body capacitor $C_{DBN}$ of the NMOS inverter transistor 17 and a parasitic drain-to-body capacitor $C_{DBP}$ of the PMOS inverter transistor 18 are shown.

During operation of the crystal oscillator, sharp signal transitions in an output oscillation signal 51 can lead to currents that flow through the parasitic drain-to-body capacitor $C_{DBN}$ of the NMOS inverter transistor 17 and/or the parasitic drain-to-body capacitor $C_{DBP}$ of the PMOS inverter transistor 18. These feedthrough or displacement currents increase the risk of latch-up arising from inadvertent activation of parasitic silicon-controlled rectifier (SCR) structures that can be present in a layout of the inverter. In addition, as the inverter's output (OUT) switches, the output swings between the voltage potential of the reference voltage VREF and the ground voltage GND. At these operating points, the parasitic drain-body diodes of the NMOS inverter transistor 17 (when OUT=GND) or the PMOS inverter transistor 18 (when OUT=VREF) will become slightly forward biased, injecting current which could lead to accidental turn-on of embedded SCR structures. If the inverter's output swings beyond the power supply rails (>VREF, or <GND) due to parasitic inductance (including the motional inductance $L_m$ of a crystal), the latch-up risk increases.

Moreover, the current through the parasitic drain-to-body capacitor $C_{DBN}$ of the NMOS inverter transistor 17 can flow through the first body resistor $R_{BN}$ and lead to NMOS body noise 53, while the current through the parasitic drain-to-body capacitor $C_{DBP}$ of the PMOS inverter transistor 18 can flow through the second body resistor $R_{BP}$ and lead to PMOS body noise 54. Various techniques are disclosed herein to reduce or eliminate displacement currents and/or diode currents to mitigate latch-up risks or otherwise improve performance.

Figure 5A:
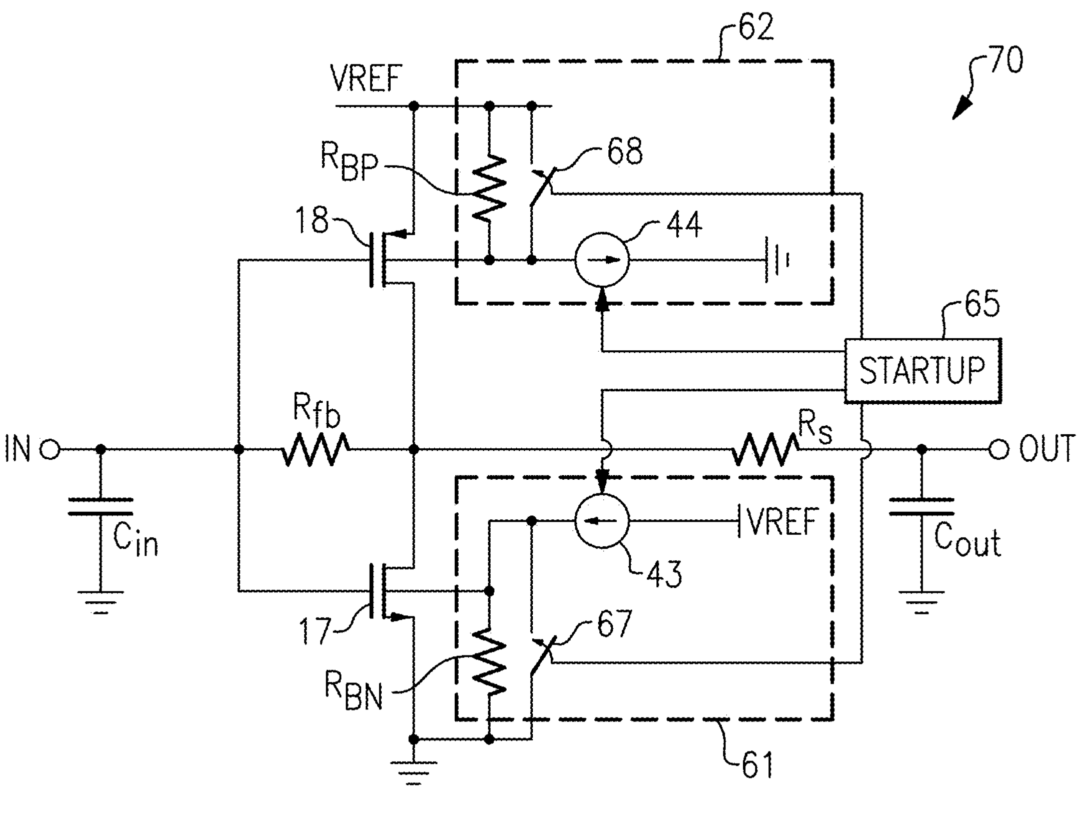
FIG. 5A is a schematic diagram of back gate bias circuitry for a crystal oscillator according to another embodiment.

FIG. 5A is a schematic diagram of back gate bias circuitry 70 for a crystal oscillator according to another embodiment.

The back gate bias circuitry 70 of FIG. 5A is similar to the back gate bias circuitry 50 of FIG. 3, except that the NMOS back gate bias circuit 61 of FIG. 5A further includes a first bypass switch 67 in parallel with the first body resistor $R_{BN}$ and the PMOS back gate bias circuit 62 of FIG. 5A further includes a second bypass switch 68 in parallel with the second body resistor $R_{BP}$.

As shown in FIG. 5A, a startup circuit 65 controls the first bypass switch 67 and the second bypass switch 68 to selectively bypass the body resistors to reduce the noise performance degradation discussed above with reference to FIG. 4. In one example, the startup circuit 65 turns off the first and second bypass switches 67/68 during startup when the controllable current sources 43/44 are activated, and turns on the first and second bypass switches 67/68 during steady state operation of the crystal oscillator when the controllable current sources 43/44 are deactivated. When turned on, the first and second bypass switches 67/68 can conduct feedthrough currents from parasitic drain-to-body capacitors and reduce the forward bias voltage of parasitic drain-to-body diodes to thereby reduce the risk of latch-up and/or prevent noise performance degradation arising from body noise.

Figure 5B:
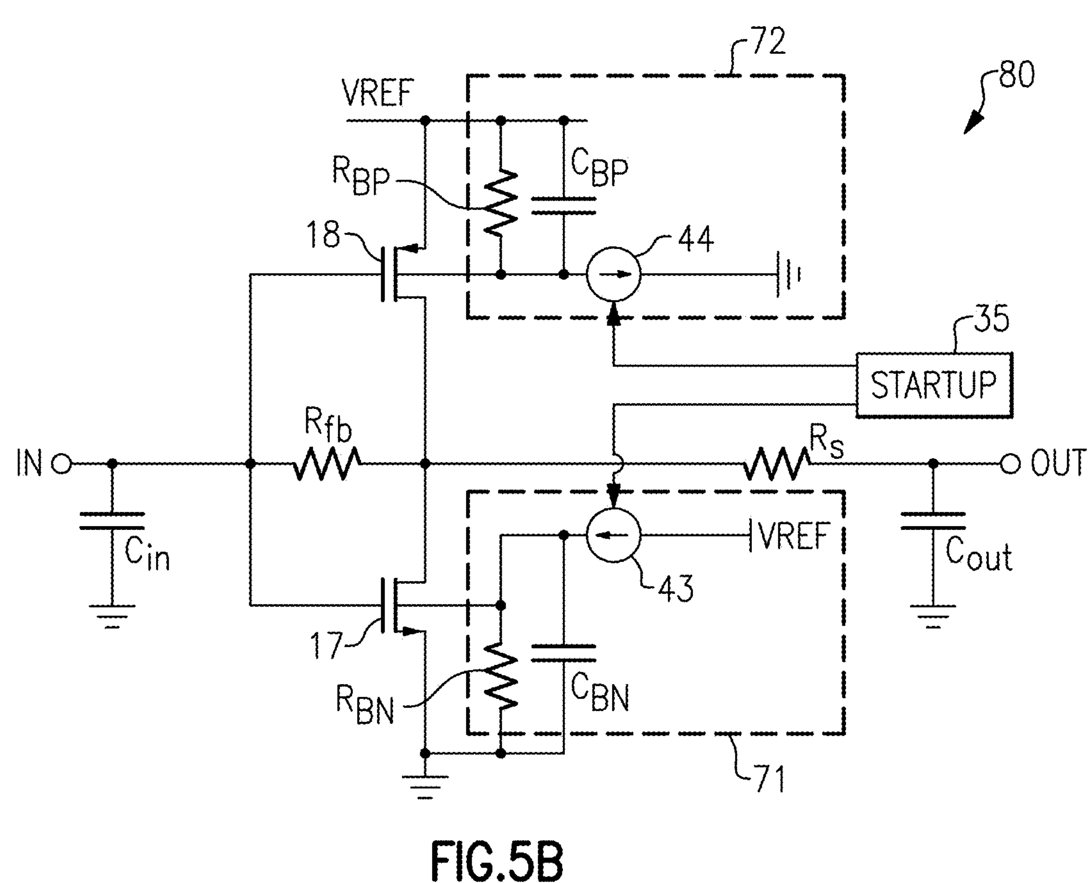
FIG. 5B is a schematic diagram of back gate bias circuitry for a crystal oscillator according to another embodiment.

FIG. 5B is a schematic diagram of back gate bias circuitry 80 for a crystal oscillator according to another embodiment.

The back gate bias circuitry 80 of FIG. 5B is similar to the back gate bias circuitry 50 of FIG. 3, except that the NMOS back gate bias circuit 71 of FIG. 5B further includes a first filtering capacitor $C_{BN}$ in parallel with the first body resistor $R_{BN}$ and the PMOS back gate bias circuit 72 of FIG. 5B further includes a second filtering capacitor $C_{BP}$ in parallel with the second body resistor $R_{BP}$.

The filtering capacitors $C_{BN}/C_{BP}$ operate in combination with the body resistors $R_{BN}/R_{BP}$ to provide low pass filtering to the body voltages of the NMOS inverter transistor 17 and the PMOS inverter transistor 18. This low pass filtering reduces the noise performance degradation discussed above with reference to FIG. 4 and/or reduces the risk of latch-up.

Figure 6:
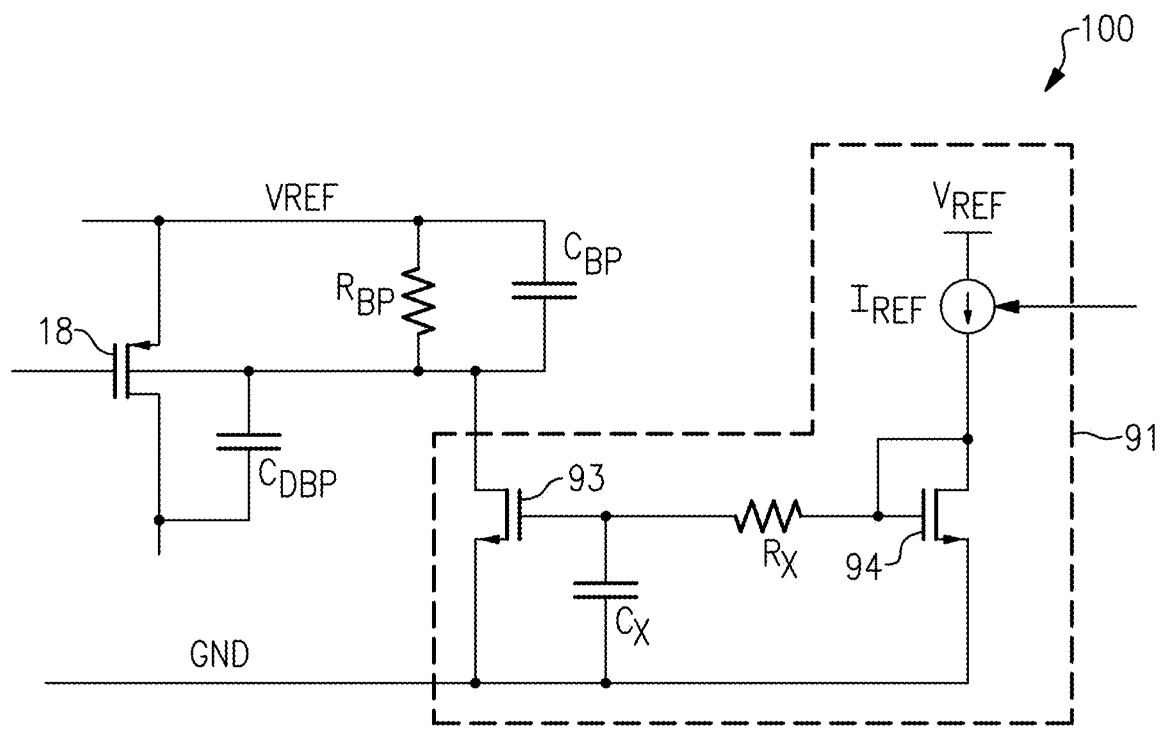
FIG. 6 is a schematic diagram of back gate bias circuitry for a crystal oscillator according to another embodiment.

FIG. 6 is a schematic diagram of back gate bias circuitry 100 for a crystal oscillator according to another embodiment.

In the illustrated embodiment, a controllable current source 91, a body resistor $R_{BP}$, and a body capacitor $C_{BP}$ of the back gate bias circuitry 100 are shown alongside a PMOS inverter transistor 18 that has a parasitic drain-to-body $C_{DBP}$ capacitance. The controllable current source 91 depicts one implementation of a controllable current source that can be controlled by a startup circuit to provide a negative resistance enhancement to a crystal oscillator during startup.

As shown in FIG. 6, the controllable current source 91 includes a first current mirror NMOS transistor 93, a second current mirror NMOS transistor 94, a current mirror capacitor $C_X$, a current mirror resistor Rx, and a reference current source $I_{REF}$ that is selectively enabled by a startup circuit (not shown in FIG. 6). When the reference current source $I_{REF}$ is turned on by the startup circuit, the controllable current source 91 provides a current $\alpha*I_{REF}$, where $\alpha$ is a parameter that can be chosen by design of the current mirror. Additionally, when the current source $I_{REF}$ is turned off by the startup circuit, the controllable current source 91 provides little to no current.

Figure 7:
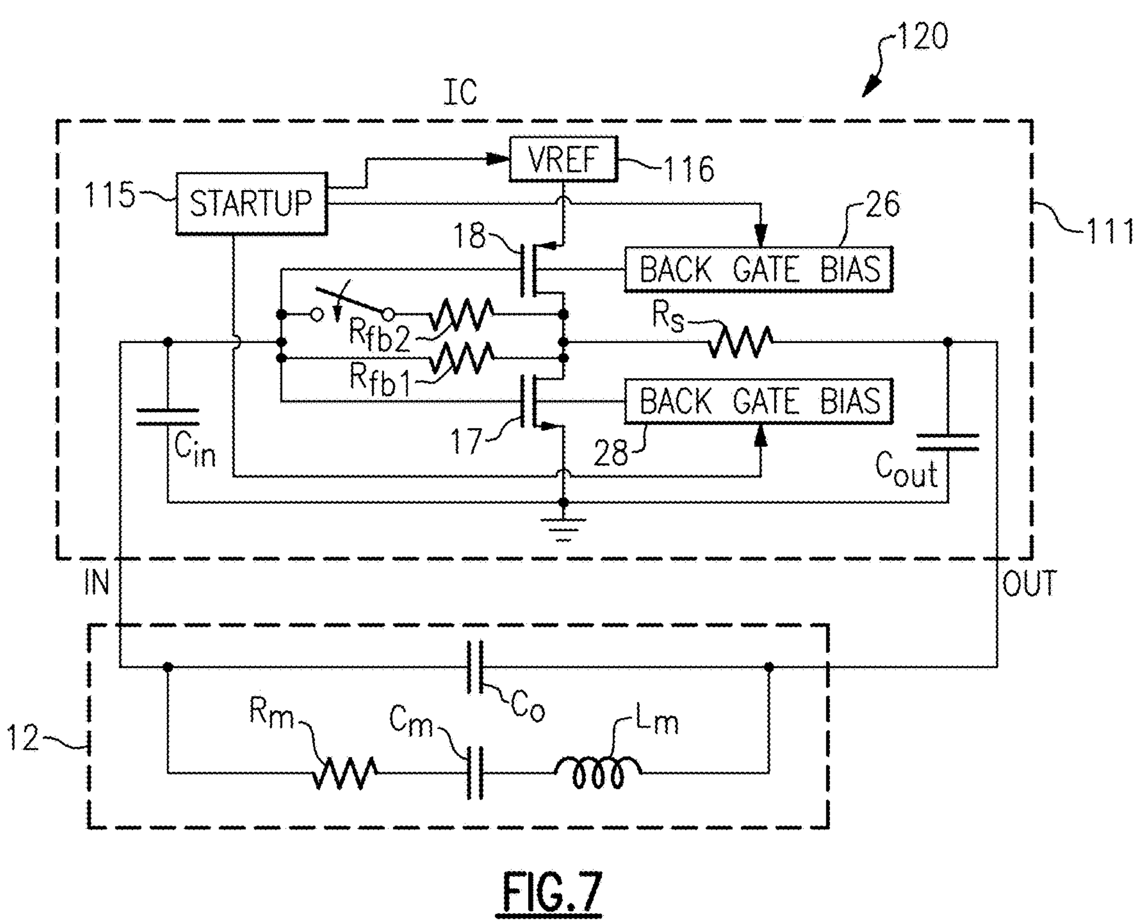
FIG. 7 is a schematic diagram of a crystal oscillator according to another embodiment.

FIG. 7 is a schematic diagram of a crystal oscillator 120 according to another embodiment. The crystal oscillator 120 includes an IC 111 and a crystal 12.

The IC 111 of FIG. 7 is similar to the IC 11 of FIG. 1B, except that the IC 111 of FIG. 7 further includes a reference voltage control circuit 116 that adjusts a voltage level of the reference voltage to the source of the PMOS inverter transistor 18 based on a control signal from a startup circuit 115.

In certain implementations, the reference voltage control circuit 116 temporarily increases the voltage level of the reference voltage during startup to provide a further enhancement to the inverter's negative resistance. Thus, in addition to controlling body voltage, the reference voltage to an inverter can also be controlled during startup to enhance negative resistance.

Figure 8:
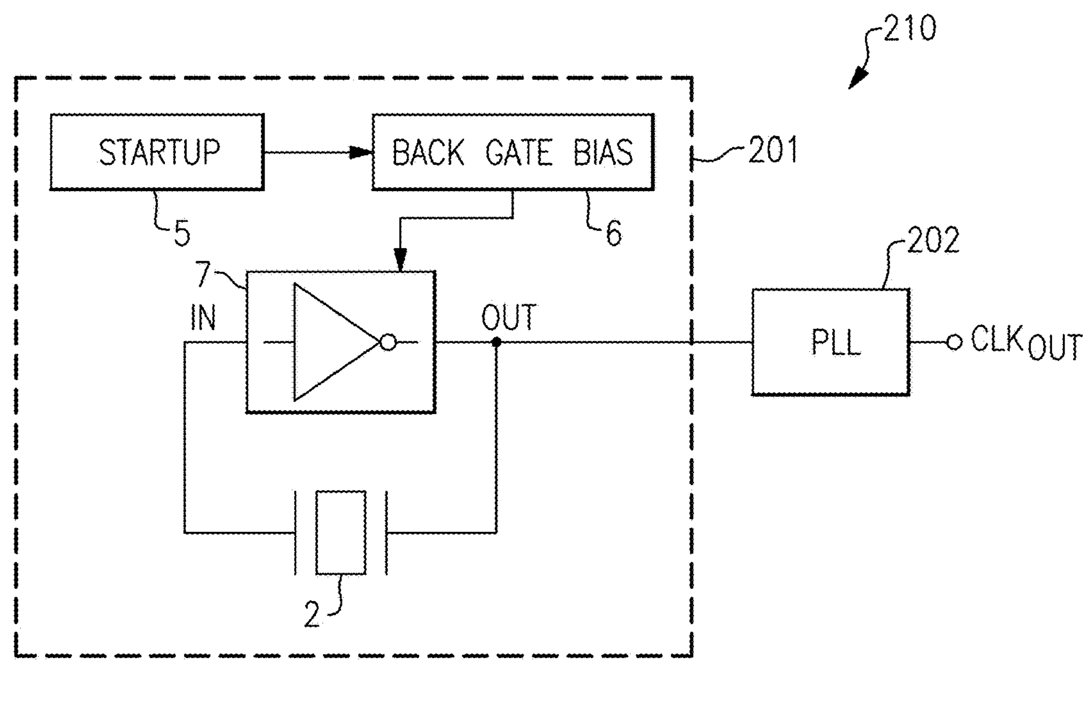
FIG. 8 is a schematic diagram of a timing system according to one embodiment.

FIG. 8 is a schematic diagram of a timing system 210 according to one embodiment. The timing system 210 includes a crystal oscillator 201 and a PLL 202.

The crystal oscillator 201 includes a crystal 2, a startup circuit 5, a back gate bias circuit 6, and an inverter 7. The crystal oscillator 201 can be implemented in accordance with any of the embodiments herein.

As shown in FIG. 8, the crystal oscillator 201 generates a clock input signal to the PLL 202. The PLL 202 uses the clock input signal as a timing reference to generate an output clock signal $CLK_{OUT}$. The PLL 202 can be an integer-N PLL or a fractional-N PLL.

Figure 9:
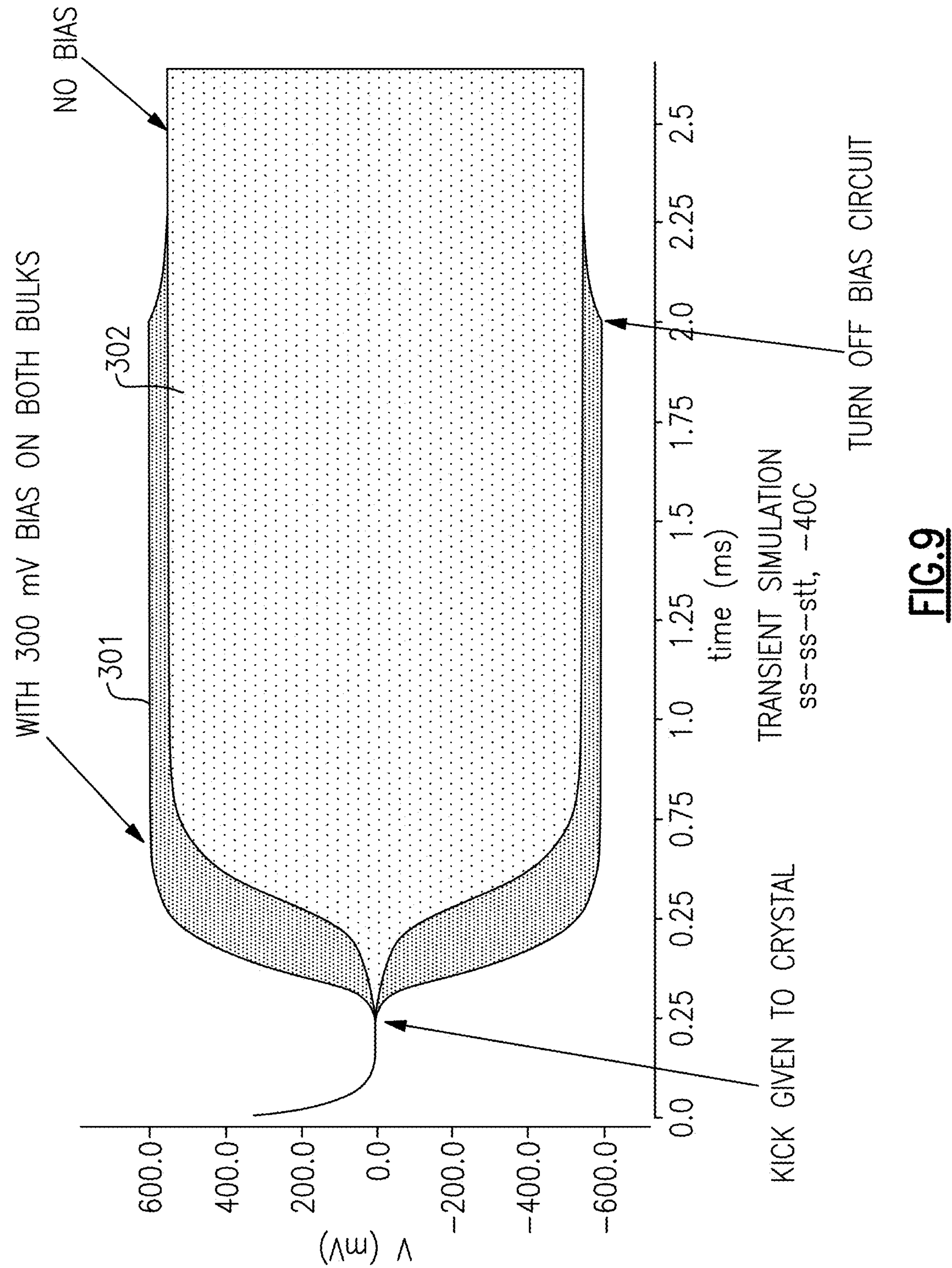
FIG. 9 is one example of a graph of output voltage versus time for various crystal oscillators at startup.

FIG. 9 is one example of a graph of output voltage versus time for various crystal oscillators at startup. The graph includes a first startup simulation 301 in which 300 mV of body bias is provided for both an NMOS transistor and a PMOS transistor of the crystal oscillator's inverter. The graph also includes a second startup simulation 302 in which no body bias is provided.

As shown in FIG. 9, providing the body bias shortens startup time and increases the magnitude of signal oscillations to provide a more robust startup. As shown in the first startup simulation 301 of FIG. 9, the body bias is provided temporarily during startup and later turned off. Thus, the steady state performance of the crystal oscillator is not impacted.

Figure 10:
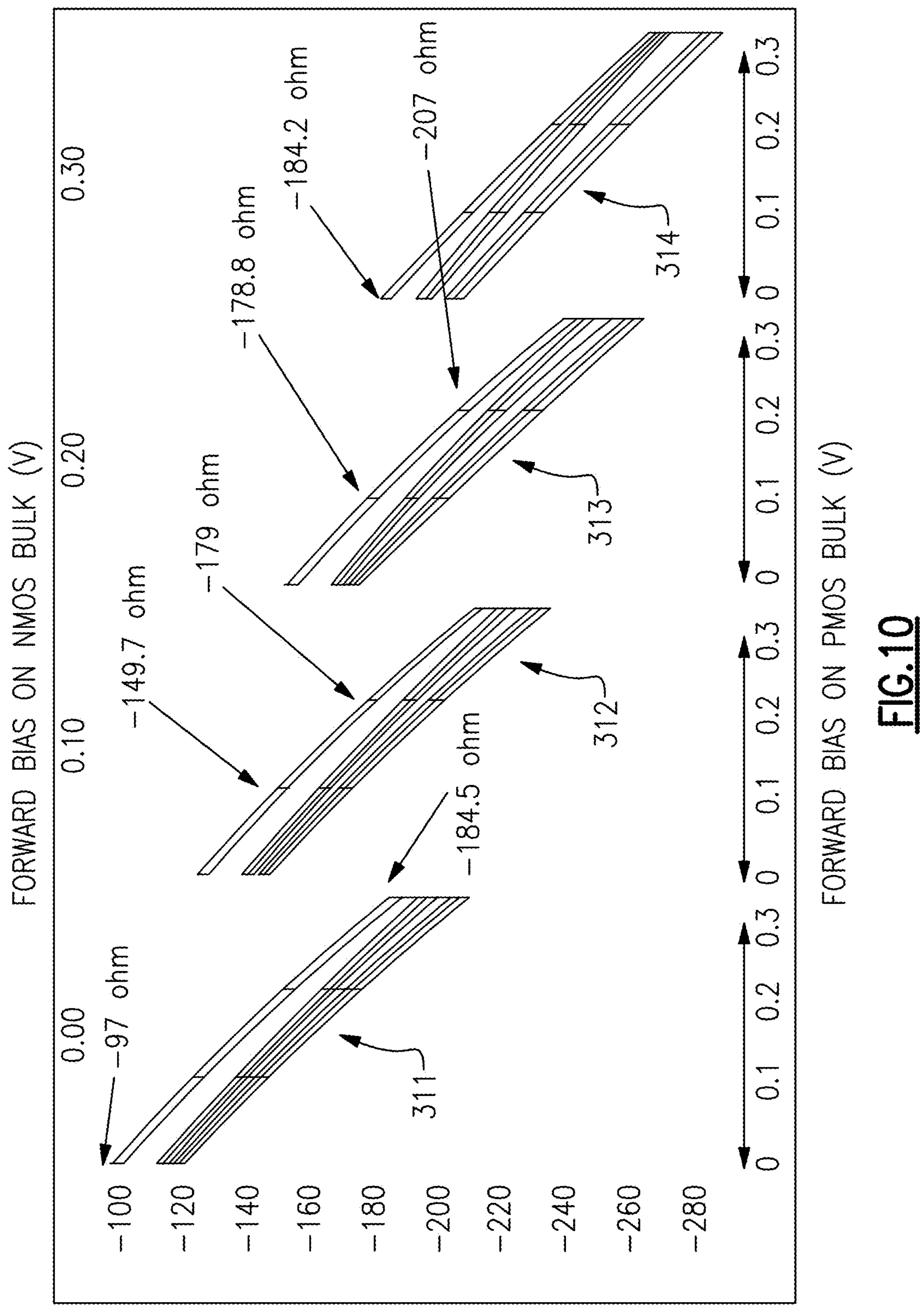
FIG. 10 is one example of a graph of negative resistance of a crystal oscillator versus back gate bias.

FIG. 10 is one example of a graph of negative resistance of a crystal oscillator versus back gate bias. The x-axis depicts PMOS forward body bias, while the y-axis depicts a worst-case negative resistance of the crystal oscillator for operation at 54 MHz. The graph includes a first group of simulations 311 for 0 mV of NMOS forward body bias, a second group of simulations 312 for 100 mV of NMOS forward body bias, a third group of simulations 313 for 200 mV of NMOS forward body bias, and a fourth group of simulations 314 for 300 mV of NMOS forward body bias.

As shown in FIG. 10, both PMOS forward body bias and NMOS forward body bias improves the crystal oscillator's worst case negative resistance.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "may," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A crystal oscillator comprising:

a crystal;

an inverter having an input connected to a first terminal of the crystal and an output connected to a second terminal of the crystal, the inverter including an n-type metal oxide semiconductor transistor and a p-type metal oxide semiconductor transistor configured to invert an input oscillation signal from the crystal; and a back gate bias control circuit configured to adjust a negative resistance of the inverter by controlling a body bias of at least one of the n-type metal oxide semiconductor transistor or the p-type metal oxide semiconductor transistor, the back gate bias control circuit including a first body resistor connected between a body and a source of one of the n-type metal oxide semiconductor transistor or the p-type metal oxide semiconductor transistor, and a first controllable current source configured to provide a first current to the first body resistor.

2. The crystal oscillator of claim 1 wherein the back gate bias control circuit controls a body bias of both the n-type metal oxide semiconductor transistor and the p-type metal oxide semiconductor transistor.

3. The crystal oscillator of claim 1 wherein the back gate bias control circuit sets the back gate bias to a first level during startup of the crystal oscillator and to a second level during steady state operation of the crystal oscillator.

4. The crystal oscillator of claim 1 wherein the back gate bias control circuit further includes a first bypass switch connected in parallel with the first body resistor.

5. The crystal oscillator of claim 1 wherein the back gate bias control circuit further includes a first filtering capacitor connected in parallel with the first body resistor.

6. The crystal oscillator of claim 1 wherein the back gate bias control circuit includes a second body resistor connected between a body and a source of the other of the n-type metal oxide semiconductor transistor or the p-type metal oxide semiconductor transistor, and a second controllable current source configured to provide a second current to the second body resistor.

7. The crystal oscillator of claim 1 further comprising a reference voltage control circuit configured to provide a reference voltage to a source of the p-type metal oxide semiconductor transistor, the reference voltage control circuit configured to further adjust the negative resistance of the inverter by controlling a voltage level of the reference voltage.

8. The crystal oscillator of claim 7 wherein the reference voltage control circuit sets the reference voltage to a first level during startup and to a second level during steady state operation.

9. The crystal oscillator of claim 1 wherein a source of the p-type metal oxide semiconductor transistor is connected to a reference voltage, a gate of the p-type metal oxide semiconductor transistor is connected to an input of the inverter, a drain of the p-type metal oxide semiconductor transistor is connected to an output of the inverter, a source of the n-type metal oxide semiconductor transistor is connected to a ground voltage, a gate of the n-type metal oxide semiconductor transistor is connected to the input of the inverter, and a drain of the n-type metal oxide semiconductor transistor is connected to the output of the inverter.

10. The crystal oscillator of claim 9 further comprising a first feedback resistor connected between the input and the output of the inverter, and a second feedback resistor and a switch connected in series between the input and the output of the inverter.

11. A method of generating an oscillation signal using a crystal oscillator, the method comprising:

receiving an input oscillation signal from a crystal as an input to an inverter;

inverting the input oscillation using an n-type metal oxide semiconductor transistor and a p-type metal oxide semiconductor transistor of the inverter;

adjusting a negative resistance of the inverter by controlling a body bias of at least one of the n-type metal oxide semiconductor transistor or the p-type metal oxide semiconductor transistor using a back gate bias control circuit;

providing a reference voltage to a source of the p-type metal oxide semiconductor transistor using a reference voltage control circuit; and further adjusting the negative resistance of the inverter by controlling a voltage level of the reference voltage.

12. The method of claim 11 wherein adjusting the negative resistance includes controlling a body bias of both the n-type metal oxide semiconductor transistor and the p-type metal oxide semiconductor transistor.

13. The method of claim 11 wherein the back gate bias control circuit sets the back gate bias to a first level during startup and to a second level during steady state operation.

14. The method of claim 11 wherein the reference voltage control circuit sets the reference voltage to a first level during startup and to a second level during steady state operation.

15. A timing system comprising:

a phase locked-loop configured to receive a reference clock signal;

a crystal oscillator including a crystal, an inverter having an input connected to a first terminal of the crystal and an output connected to a second terminal of the crystal, the inverter including an n-type metal oxide semiconductor transistor and a p-type metal oxide semiconductor transistor configured to invert an input oscillation signal from the crystal to generate the reference clock signal, the crystal oscillator further including a back gate bias control circuit configured to adjust a negative resistance of the inverter by controlling a body bias of at least one of the n-type metal oxide semiconductor transistor or the p-type metal oxide semiconductor transistor; and a reference voltage control circuit configured to provide a reference voltage to a source of the p-type metal oxide semiconductor transistor, the reference voltage control circuit configured to further adjust the negative resistance of the inverter by controlling a voltage level of the reference voltage.

16. The timing system of claim 15 wherein the back gate bias control circuit sets the back gate bias to a first level during startup of the crystal oscillator and to a second level during steady state operation of the crystal oscillator.

17. The timing system of claim 15 wherein the back gate bias control circuit includes a first body resistor connected between a body and a source of one of the n-type metal oxide semiconductor transistor or the p-type metal oxide semiconductor transistor, and a first controllable current source configured to provide a first current to the first body resistor.

18. The method of claim 11 further comprising providing a first current from a first controllable current source to a first body resistor that is connected between a body and a source of one of the n-type metal oxide semiconductor transistor or the p-type metal oxide semiconductor transistor.

19. The method of claim 18 further comprising providing a second current from a second controllable current source to a second body resistor that is connected between a body and a source of the other of the n-type metal oxide semiconductor transistor or the p-type metal oxide semiconductor transistor.

20. The method of claim 18 further comprising controlling a first bypass switch connected in parallel with the first body resistor.

* * * * *